United States Patent [19]

Miyakawa et al.

[11] 4,100,432

[45] Jul. 11, 1978

[54] MULTIPLICATION CIRCUIT WITH FIELD EFFECT TRANSISTOR (FET)

[75] Inventors: Nobuaki Miyakawa; Masayuki Miki, both of Ibaraki, Japan

[73] Assignee: Hitachi, Ltd., Japan

[21] Appl. No.: 733,841

[22] Filed: Oct. 19, 1976

[51] Int. Cl.[2] .............................................. H03K 17/00

[52] U.S. Cl. .................................... 307/229; 307/251; 328/160

[58] Field of Search ............... 307/229, 230, 251, 241; 328/160

[56] References Cited

U.S. PATENT DOCUMENTS

| | | | |
|---|---|---|---|
| 3,368,066 | 2/1968 | Miller et al. | 328/160 |
| 3,544,812 | 12/1970 | Riso | 328/160 |
| 3,757,139 | 9/1973 | Hunter | 307/251 |
| 4,011,503 | 3/1977 | Ferrara | 307/251 |

*Primary Examiner*—Stanley D. Miller, Jr.
*Assistant Examiner*—B. P. Davis
*Attorney, Agent, or Firm*—Craig & Antonelli

[57] ABSTRACT

A drain resistor is connected to a drain electrode of a Field Effect Transistor (FET). One of the input signals to be multiplied is applied to the drain electrode through the drain resistor. The other input signal to be multiplied is applied to a gate electrode of the FET. An output proportional to the product of two signals appears across a resistor connected between a source electrode of FET and ground. In such an arrangement the resistance value of the drain resistor is so determined that the gradient of the characteristics of the drain current to the one input signal becomes almost equal to that of the characteristics of the drain current to the other input signal.

5 Claims, 11 Drawing Figures

MULTIPLICATION CIRCUIT WITH FIELD EFFECT TRANSISTOR (FET)

BACKGROUND OF THE INVENTION

A multiplication circuit which is simple in the structural arrangement can be obtained by utilizing a field effect transistor (called FET hereinafter). In such a multiplication circuit one of two variables to be multiplied is applied to a drain electrode of the FET and the other to a gate electrode thereof. Generally, the following relationship of the drain current $I_D$ to the drain-source voltage $V_{DS}$ and the gate-source voltage $V_{GS}$ is applicable to the region below the pinch-off voltage $V_P$:

$$I_D = \beta\, V_{DS} \cdot V_{GS} - \beta\, V_{DS}(V_P + \tfrac{1}{2} V_{DS})$$

wherein $\beta$ is a constant $(I_{DO}/V_P^2)$ and $I_{DO}$ represents the drain current when the drain voltage is equal to the pinch-off voltage $V_P$. As is apparent from the above equation, the drain current $I_D$ includes a component proportional to the product of the drain voltage and the gate voltage.

The multiplication circuit, however, has the following disadvantages. The first disadvantage is, although the reason is stated in detail after, in that when either of the drain voltage and the gate voltage is held constant and the other is changed, there is a difference between the output characteristics of the drain current depending on the change of the drain voltage and that of the drain current depending on the change of the gate voltage. The above fact is greatly disadvantageous to the multiplication circuit. Second, the region in which the operation can be achieved with the good linearity is very narrow, because the gradient of the $I_D$-$V_{DS}$ characteristics of FET is usually steep with respect to the drain voltage. Finally, as is understood from the above equation, the drain current $I_D$ includes a component affected by the pinch-off voltage $V_P$ and a component proportional to the second power of the drain voltage, besides the component proportional to the product of the drain voltage and the gate voltage. These components function as an error in the result of operation. Especially, the pinch-off voltage $V_P$ is easily affected by the temperature. This is aspect of an FET.

SUMMARY OF THE INVENTION

An object of the present invention is to provide an improved multiplication circuit without any of the above stated disadvantages.

Another object of the present invention is to provided a multiplication circuit in which the multiplication can be executed without any influence caused by the variation of the temperature of circumference.

Still another object of this invention is to provide a multiplication circuit the output of which does not include any error components.

According to an embodiment of the present invention, the above object can be solved by a multiplication circuit with an FET, the a drain and gate electrodes of which are supplied with first and second input signals to be multiplied, respectively, and a resistor means is inserted into a circuit through which the drain current of FET flows, the resistance value of the resistor means being so selected that the gradient of the characteristics of the drain current against the first input signal becomes substantially equal to that of the characteristic of the drain current against the second input signal.

In another embodiment of the present invention there are provided a pair of FET circuits in which the drain electrodes of both FETs are supplied in common with the first input signal and the gate electrode of either one of both FETs with the second input signal, and the drain currents of both FET circuits are led to a differential amplifier. The output signal of the differential amplifier which is proportional only to the product of the first and the second input signals can be obtained by this embodiment.

Other objects and features of the present invention will be clearly understood by reading the description stated hereinafter in connection with accompanying drawings.

DETAILED DESCRIPTION OF THE PREFERRED EMBODIMENTS

Figure 2:
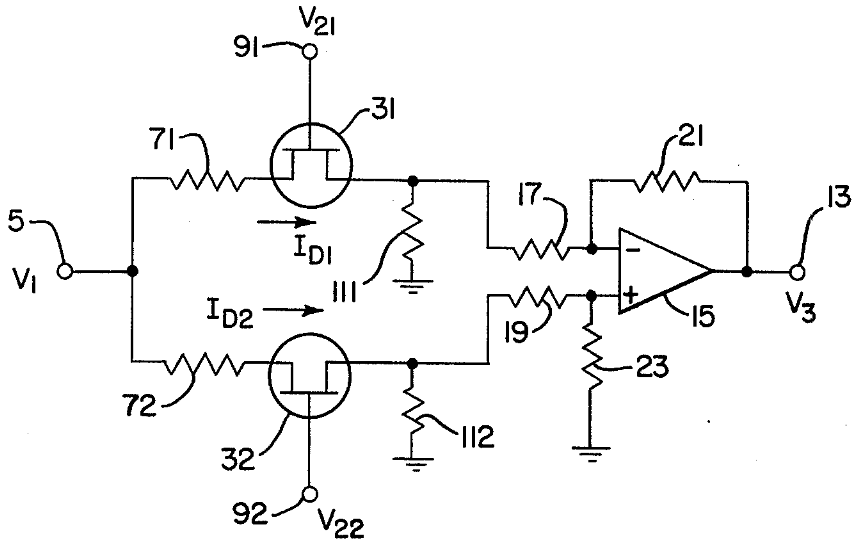
FIG. 2 shows a circuit arrangement in accordance with another embodiment of the invention, FIGS. 3 (*a*) and 3 (*b*) shows temperature characteristics of output in the circuit arrangement of FIG. 2.
Figure 1B:
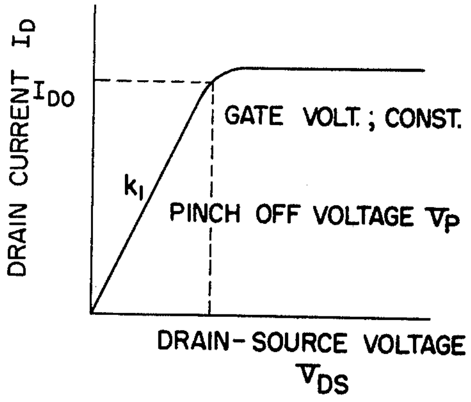
FIG. 1 (*a*) shows the circuit arrangement according to an embodiment of the invention, which is also utilized for the purpose of explanation of the principle of the invention, FIGS. 1 (*b*) to 1 (*f*) are drawings representing various characteristics in order to explain the principle of operation of the circuit arrangement shown in FIG. 1 (*a*)
Figure 1C:
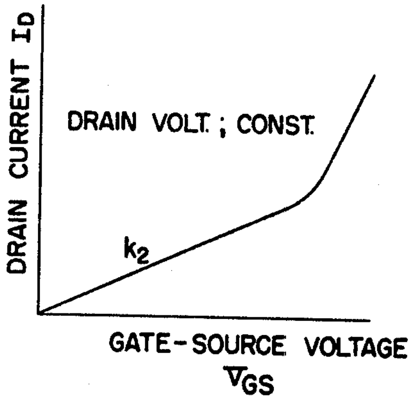
Figure 1D:
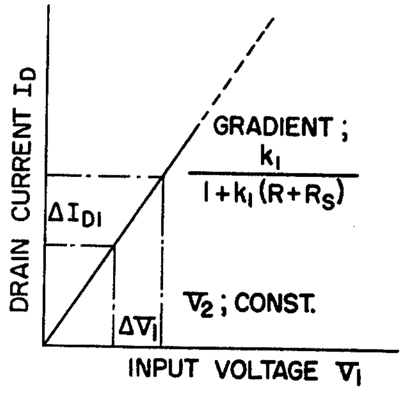
Figure 1E:
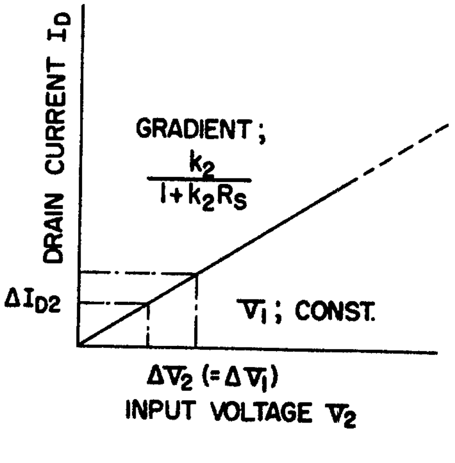
Figure 1F:
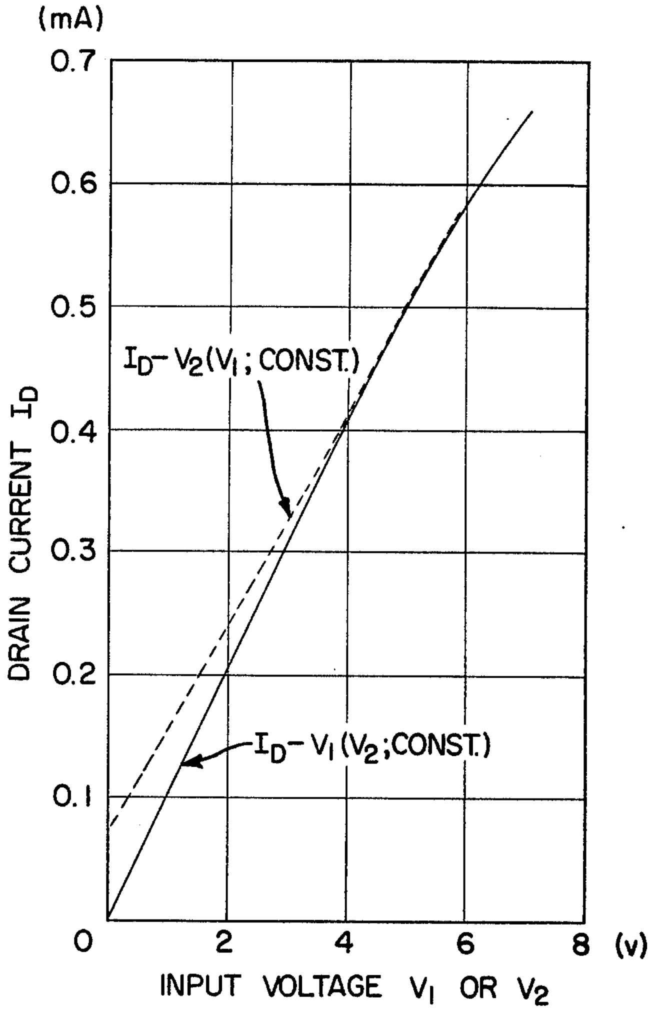

Referring to FIGS. 1 (*a*) to 1 (*f*), the explanation will, at first, be made of the principle of a multiplication circuit according to the invention. In FIG. 1 (*a*), as is well known, FET 3 has three electrodes, namely drain, gate and source electrodes. The drain electrode is connected to a terminal 5 through a drain resistor 7 and the gate electrode directly to a terminal 9. Input voltage signals $V_1$ and $V_2$ proportional to the variables to be multiplied are applied to the termiansl 5 and 9, respectively. The source electrode of FET 3 is grounded through a resistor 11 and further connected to a terminal 13, at which the output $V_0$ appears as a voltage according to the product of $V_1$ and $V_2$. In the arrangement of this figure the foregoing equation becomes as follows;

$$I_D = \beta\,(V_D - V_0)(V_2 - V_0) - \beta\,(V_D - V_0)\{V_P + \tfrac{1}{2}(V_D - V_0)\} \qquad (1)$$

Further, provided that the values of the resistors 7 and 11 are R and $R_S$, respectively, the following equations are established in the arrangement shown;

$$\left.\begin{aligned} V_D &= V_1 - RI_D \\ V_O &= R_S I_D \end{aligned}\right\} \qquad (2)$$

On the other hand, in view of the characteristics of $I_D - V_{DS}$ and $I_D - V_{GS}$ as shown in FIGS. 1 (*b*) and 1 (*c*) which indicate the typical characteristics of FET, the drain current $I_D$ is also represented by the following equations;

$I_D = k_1 V_{DS}$ - - - from FIG. 1 (*b*)

$I_D = k_2 V_{GS}$ - - - from FIG. 1 (*c*)

accordingly, in the case of FIG. 1 (*a*)

$$I_D = k_1 (V_D - V_0) \quad (3)$$

$$I_D = k_2 (V_2 - V_0) \quad (4)$$

By substitution of the equation (2) into the equation (3) and by rearrangement with respect to the drain current $I_D$;

$$I_D = \frac{k_1}{1 + k_1 (R + R_S)} V_1 \quad (5)$$

Consequently, from the relationship of the equations (3) and (5), $$V_D - V_0 = K_1 V_1 \quad (6)$$

wherein $$K_1 = \frac{1}{1 + k_1 (R + R_S)}$$

In accordance with the similar process, in which the equations (2) and (4) are utilized;

$$I_D = \frac{k_2}{1 + k_2 R_S} V_2 \quad (7)$$

$$V_2 - V_0 = K_2 V_2 \quad (8)$$

wherein $$K_2 = \frac{1}{1 + k_2 R_S}$$

By substituting the equations (6) and (8) into the equation (1), $$I_D = \beta K_1 V_1 \cdot K_2 V_2 - \beta K_1 V_1 (V_P + \tfrac{1}{2} K_1 V_1) \quad (9)$$

As is apparent from the above equation, the drain current $I_D$ includes a component proportional to the product of the two inputs $V_1$ and $V_2$. It will, therefore, be understood that the arrangement shown in FIG. 1 (*a*) can be utilized for the multiplication circuit. The arrangement shown, however, has such a disadvantage as stated before. It results from the relationship as represented by the equations (5) and (7) between the drain current $I_D$ as the output and the voltages $V_1$ and $V_2$ as the inputs to be multiplied.

FIGS. 1 (*d*) and 1 (*e*) schematically show the relationship of the equations (5) and (7). As is apparent from both the figures, gradients of both the characteristics are different from each other. This fact means that the deviation $\Delta I_{D1}$ of the drain current $I_D$ caused by the change $\Delta V_1$ of the voltage $V_1$ differs from the deviation $\Delta I_{D2}$ caused by the change $\Delta V_2$ of the voltage $V_2$ which is equal to $\Delta V_1$.

In order to remove the disadvantage the following requirement is necessary:

$$\frac{k_1}{1 + k_1 (R + R_S)} = \frac{k_2}{1 + k_2 R_S}$$

-continued namely $$R = \frac{k_1 - k_2}{k_1 \cdot k_2} \quad (10)$$

The above described disadvantage is removed by selecting the resistance value of the resistor 7 so as to satisfy the relationship of the equation (10).

An example of the results of the inventors' experiment is presented in FIG. 1 (*f*). The FET utilized in the experiment is of type μPA34A manufactured by NEC (Japan), which is a so called depletion type. The resistors 7 and 11 were of 1.5 and 6.8 KΩ in resistance. As is appearent from this figure, excellent coincidence is observed between both curves for the range over about 3 volts of the input voltage and further it is understood that the characteristic with the good linearity can be obtained within the range of 3 to 6 volts. This means that the multiplication operation is achieved with the good linearity and without the disadvantage stated before. Between the $I_D$-$V_2$ and the $I_D$-$V_1$ characteristics the difference of a little amount remains within the range below 2 volts of the input voltage. As is well known, however, this results from the $I_D$-$V_{GS}$ characteristics itself of the depletion type FET. It will be easily understood that, if an so-called enhancement type FET is used, almost perfect coincidence can be obtained between both characteristics over the almost whole range of the input voltage.

An attempt will be made to examine the above stated principle of this invention by use of the experimental result of FIG. 1 (*f*). Let the values of $k_1$ and $k_2$ be obtained by utilizing the experimental result and the equations (5) and (7). The results thereof are as follows:

$$k_1 = 0.588 \times 10^{-3}$$

$$k_2 = 0.213 \times 10^{-3}$$

By substituting these values of $k_1$ and $k_2$ into the equation (10), the theoretical resistance R of the resistor 7 can be obtained as follows:

$$R = (k_1 - k_2 / k_1 \cdot k_2) = 2.99\ (K\Omega)$$

This theoretical value is nearly twice as large as the actual resistance of the resistor 7 which was used in the inventors' experiment. There is, however, no large difference as a unit or order between both. As stated before, if the enhancement type FET is used, the coincidence between the theoretical and the actual values will be much more improved.

Referring now to FIG. 2, the explanation will be made of another embodiment according to this invention. In this embodiment a pair of FET circuits are provided, namely one of them includes FET 31 and the other FET 32. A drain electrode of FET 31 is connected to one of terminals of a drain resistor 71. A source electrode thereof is grounded through a resistor 111. A gate electrode of FET 31 is connected to a terminal 91 at which one of input voltage signals $V_{21}$ is applied. In the same way a drain electrode of FET 32 is connected to one of terminals of a drain resistor 72. A source electrode is grounded through a resistor 112. A gate electrode is connected to a terminal 92 which is provided with another input voltage signal $V_{22}$. The other terminals of both the drain resistors 71 and 72 are connected in common to the terminal 5, to which the remaining input voltage signal $V_1$ is applied. The voltages appearing across the resistors 111 and 112 are led to a minus and a plus terminals of an operational amplifier 15 through resistors 17 and 19, respectively. The output of the amplifier 15 is led to the terminal 13 and also fed back to the minus terminal of the amplifier 15 through a feed back resistor 21. The plus terminal of the amplifier 15 is also grounded through a resistor 23. The operational amplifier 15 and the resistors 17, 19, 21 and 23 form a so called differential amplifier circuit.

In the arrangement described above, the following two equations are established with respect to the respective FET circuits.

$$I_{D1} = \beta_1 K_{11} V_1 \cdot K_{12} V_{21} - \beta_1 K_{11} V_1 (V_{P1} + \tfrac{1}{2} K_{11} V_1)$$

$$I_{D2} = \beta_2 K_{21} V_1 \cdot K_{22} V_{22} - \beta_2 K_{21} V_1 (V_{P2} + \tfrac{1}{2} K_{21} V_1)$$

wherein $\beta_1$, $\beta_2$ and $V_{P1}$, $V_{P2}$; $\beta$ and $V_P$ of FET 31 and 32, respectively $$K_{11} = \frac{1}{1 + k_{11}(R + R_S)},\ K_{12} = \frac{1}{1 + k_{12} R_S}$$

$k_{11}$, $k_{12}$; $k_1$ and $k_2$ of *FET* 31.

$$K_{21} = \frac{1}{1 + k_{21}(R + R_S)},\ K_{22} = \frac{1}{1 + k_{22} R_S}$$

$k_{21}$, $k_{22}$; $k_1$ and $k_2$ of *FET* 32

Provided that an FET with the same characteristic is utilized as FETs 31 and 32;

$$k_{11} = k_{21} = k_1$$

$$k_{12} = k_{22} = k_2$$

Accordingly;

$$K_{11} = K_{21} = K_1$$

$$K_{12} = K_{22} = K_2$$

Further, since $\beta_1 = \beta_2 = \beta$, $V_{P1} = V_{P1} = V_{P2} = V_{P1}$, the above two equations can be rewritten as follows.

$$I_{D1} = \beta K_1 V_1 \cdot K_2 V_{21} - \beta K_1 V_1 (V_P + \tfrac{1}{2} K_1 V_1) \quad (11)$$

$$I_{D2} = \beta K_1 V_1 \cdot K_2 V_{22} - \beta K_1 V_1 (V_P + \tfrac{1}{2} K_1 V_1) \quad (12)$$

Consequently, the following voltage drop appears across the resistors 111 and 112, provided that the resistance of the resistors is both $R_S$.

$$V_{S1} = R_S I_{D1} \text{ and } V_{S2} = R_S I_{D2}$$

Now, the output $V_3$ of the amplifier 15 is represented by the following equation, if the gain of the amplifier is infinite.

$$V_3 = R_2/R_1 (V_{S2} - V_{S1})$$

where $R_1$ is the resistance of the resistors 17 and 19, and $R_2$ is that of the resistors 21 and 23.

If the resistance of those resistors is so selected that $R_1$ is equal to $R_2$, $$V_3 = V_{S2} - V_{S1} = R_S(I_{D2} - I_{D1}) \quad (13)$$

By substituting the equations (11) and (12) into the equation (13), $$V_3 = \beta R_S K_1 K_2 V_1 (V_{22} - V_{21}) \quad (14)$$

As is clear from the equation (14), the result of the operation executed by the arrangement of FIG. 2 does not include any error components, especially the component caused by the pinch-off voltage $V_P$ which is easily affected by the temperature.

Figure 3A:
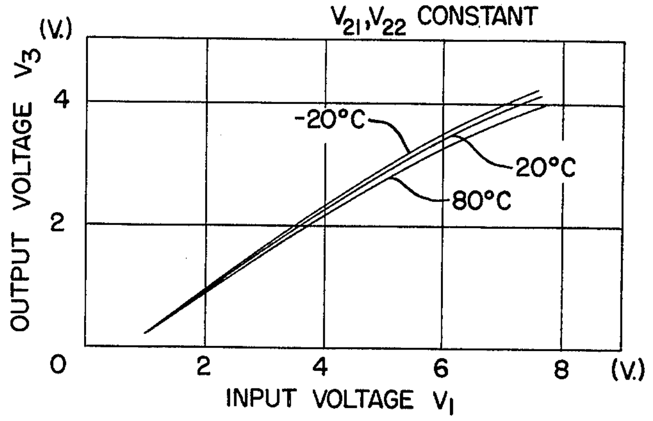
Figure 3B:
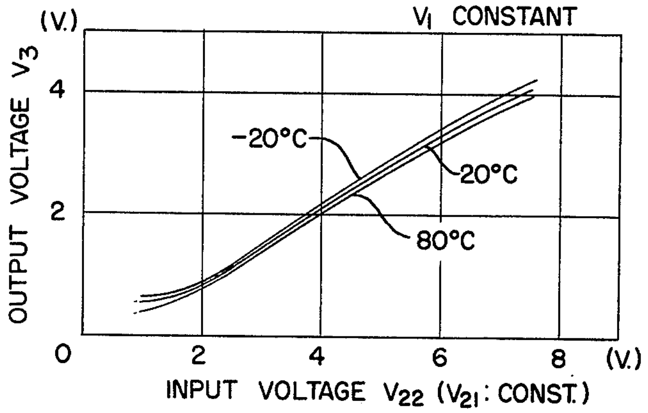

Some temperature characteristics curves according to the result of the inventors' experiment are shown in FIGS. 3 (*a*) and 3 (*b*). In the experiment, the resistances R and $R_S$ of the resistors 71, 72 and 111, 112 were 1.55 and 6.8 K, respectively and the resistances of the resistors 17, 19, 21 and 23 were 33 KΩ. As the operational amplifier LM2902 (manufactured by National Semiconductor Co. (U.S.A.)) was used. FIG. 3 (*a*) shows the output characteristics against temperature variation when the input voltage $V_{21}$, $V_{22}$ was kept constant. FIG. 3 (*b*) shows the output characteristics against temperature variation when the input voltage $V_1$ was kept constant. As is apparent from both figures, the variation rate of the output voltage $V_3$ does not exceed 5% over the wide range of the temperature change.

Figure 4:
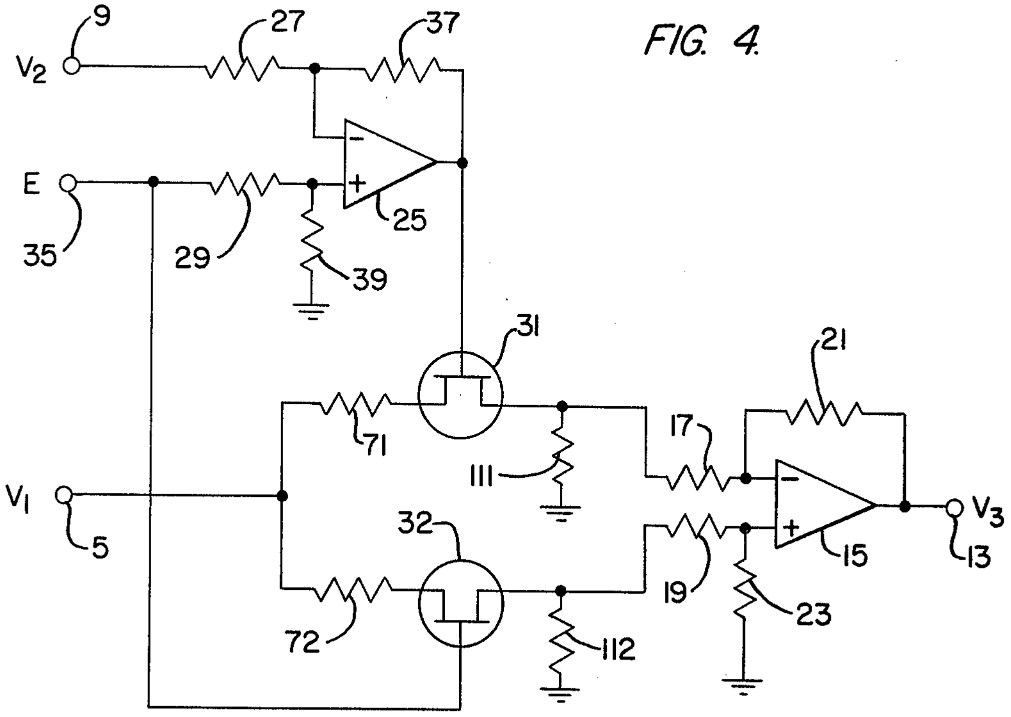
FIG. 4 shows a circuit arrangement in which the input circuit of FIG. 2 is improved.

A circuit for the gate electrode of two FETs 31 and 32 can be further improved as shown in FIG. 4. According thereto an operational amplifier circuit is provided for the input signal which is applied to the gate electrode. Other elements are the same as in FIG. 2. The same elements are, therefore, represented by the same reference numerals as in FIG. 2. This circuit comprises an operational amplifier 25 the output of which is led to the gate electrode of FET 31. A minus input terminal of the amplifier 25 is connected through a resistor 27 to the terminal 9 to which the one $V_2$ of the two variables to be multiplied is applied. A plus input terminal of the amplifier 25 is connected through a resistor 29 to a terminal 35 a constant D.C. voltage E is applied to. The constant D.C. voltage E is applied to the gate electrode of FET 32, too. Further, the output of the amplifier 25 is fed back to the minus input terminal thereof through a feed back resistor 37 and the plus input terminal of the amplifier 25 is grounded through a resistor 39. It should be here noted that the above stated operational amplifier circuit for the input signal $V_2$ is in the circuit arrangement quite similar to the operational amplifier circuit including the amplifier 15. The output voltage of the amplifier 25 is, therefore, equal to the difference $(E - V_2)$. Consequantly there is the following relationship between the arrangement of FIG. 4 and that of FIG. 2;

$$\left.\begin{aligned} V_{21} &= E - V_2 \\ V_{22} &= E \end{aligned}\right\} \quad (15)$$

By substituting the relationship of the equation (15) into the equation (14);

$$V_3 = \beta R_S K_1 K_2 V_1 V_2 = K V_1 V_2 \quad (16)$$

where $K = \beta R_S K_1 K_2$

The output voltage appearing at the terminal 13 of FIG. 4 is proportional only to the product of the two inputs $V_1$ and $V_2$.

Figure 5:
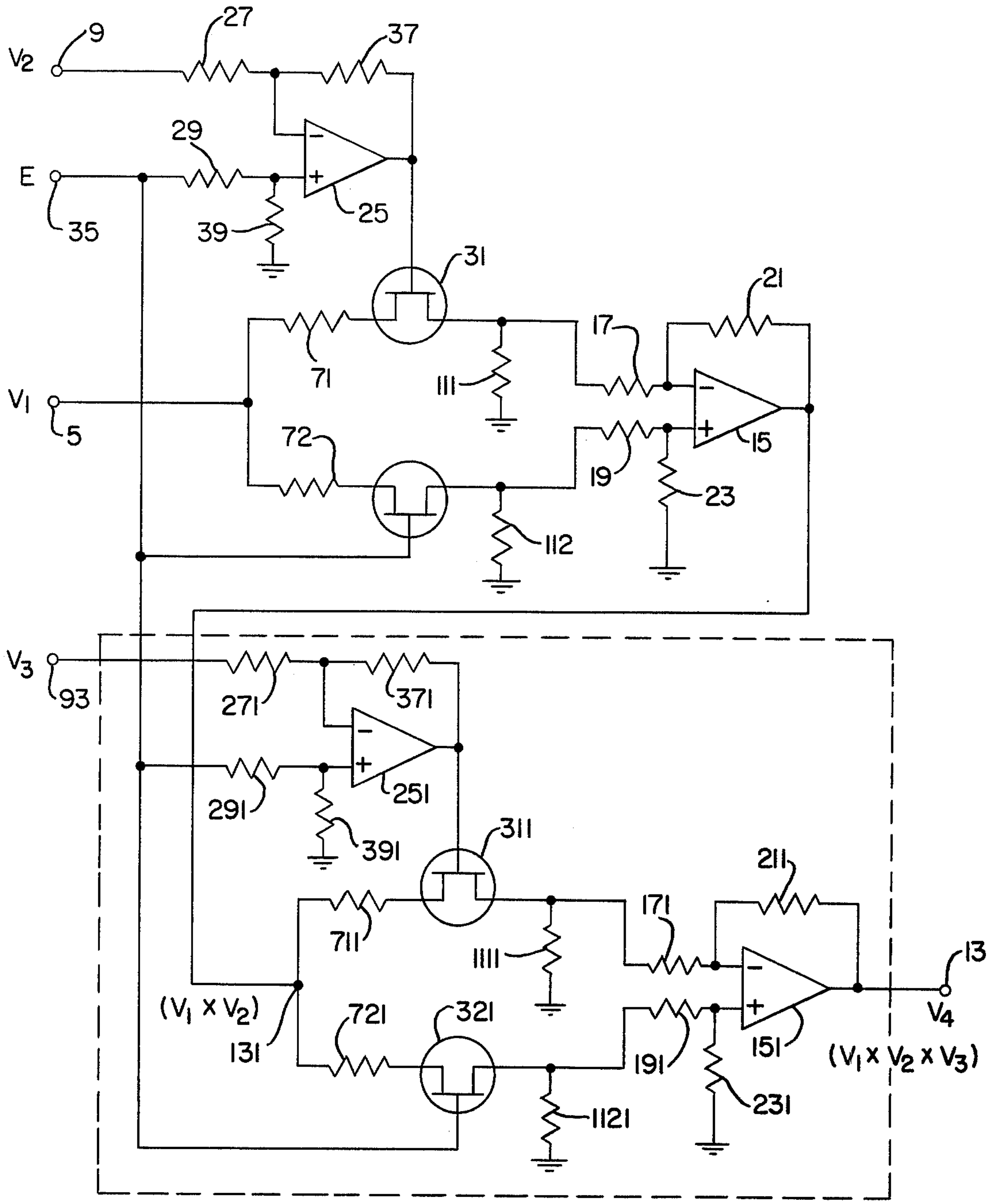
FIG. 5 shows a circuit arrangement according to still another embodiment in which the multiplication of three input signals can be executed.

The above description was made of the multiplication circuit in which the two input signals, namely $V_1$ and $V_2$ were multiplied. The idea of this invention is, however, not limited to such an application. It can be further applied to the multiplication for more than three input signals to be multiplied. FIG. 5 shows the circuit in which the multiplication for three input signals $V_1$, $V_2$ and $V_3$ can be executed. In FIG. 5 a further circuit encircled by the broken line is provided for the further multiplication of the third input $V_3$. The arrangement of the remaining part of FIG. 5 is the same as the arrangement of FIG. 4, and therefore the same elements are represented by the same reference numerals. The arrangement of the circuit encirculed by the broken line is also the same as the arrangement of FIG. 4. In this part, however, the same elements are represented by reference numerals which have an additional numeral "1" after the reference numeral of the corresponding elements.

In the arrangement of FIG. 5, as is understood from the above statement, the product of two inputs $V_1$ and $V_2$ appears as the output of the amplifier 15, which is led to the junction 131 at which drain resistors 711 and 721 are connected in common. A terminal 93 is supplied with the third input $V_3$, which is led to a minus input terminal of an amplifier 251 through a resistor 271. The constant D.C. voltage E is further applied to a plus input terminal of the amplifier 251 through a resistor 291 and to a gate electrode of FET 321. It will be easily understood that the output of an amplifier 151 is proportional to the product of the three inputs $V_1$, $V_2$ and $V_3$, because the function of the part encircled by the broken line, as well as the remaining part of the circuit of FIG. 5, is quite the same as that of FIG. 4. The circuit arrangement of FIG. 4 is a fundamental unit circuit for multiplication. By the simple cascade connection of the $(n - 1)$ fundamental unit circuits, the circuit for the $n$ inputs to be multiplied can be achieved.

We claim:

1. In a multiplication circuit having a field effect transistor, the drain and gate electrodes of which are supplied with first and second input signals to be multiplied, respectively, the improvement comprising:

a pair of field effect transistors, the drain electrodes of which are supplied in common with the first input signal and the gate electrode of one of which is supplied with the second input signal, the gate electrode of the other field effect transistor being kept at a constant voltage, resistor means connected to the respective drain electrodes, the resistance value of said resistor means being such that the gradient of the characteristic of the drain current to the first input signal is substantially equal to that of the characteristic of the drain current to the second input signal, and a differential amplifier having two input terminals which are supplied with the signals corresponding to the drain currents of said field effect transistors respectively.

2. A multiplication circuit according to claim 1, further including another differential amplifier, one of two input terminals of which is provided with the second input signal, the other input terminal of which is supplied with a constant voltage signal and the output of which is led to the gate electrode of either or both of the field effect transistors wherein the constant voltage signal is also applied to the gate electrode of the other field effect transistor.

3. A multiplication circuit comprising a field effect transistor having a drain, a source, and a gate electrode, a first of two input signals to be multiplied being applied to the drain electrode through a first resistor, a second input signal being applied to the gate electrode, and an output depending on the product of the two input signals being derived from a second resistor connected to the source electrode, wherein the resistance value of said first resistor connected to the drain electrode is such that the gradient of the characteristic of the drain current to said first input signal is substantially equal to that of the characteristic of the drain current to said second input signal.

4. In a multiplication circuit having a field effect transistor drain and gate electrodes of which are supplied with first and second input signals to be multiplied, respectively, the improvement comprising:

a pair of field effect transistors, the drain electrodes of which are supplied in common with said first input signal and the gate electrode of one of which is supplied with said second input signal, resistor means, inserted into respective circuits through which the drain current of the respective transistors flows, the resistance value thereof being such that the gradient of the characteristic of the drain current to said first input signal is substantially equal to that of the characteristic of the drain current to said second input signal, and a differential amplifier having two input terminals which are supplied with signals corresponding to the drain currents of the field effect transistors, respectively, and further including another differential amplifier, one of two input terminals of which is provided with said second input signal, the other input terminal of which is supplied with a constant voltage signal and the output of which is led to the gate electrode of at least one of said field effect transistors, and wherein the constant voltage signal is also applied to the gate electrode of the other field effect transistor.

5. The multiplication circuit for producing an output representative of the product of $n$ input signals, where $n$ is an integer greater than one, comprising:

$n$ input electrodes to which $n$ respective input signals are applied; and $n-1$ multiplier stages, each of which stages comprises a pair of field effect transistors, the drain electrodes of which are supplied in common with a first input signal and the gate electrode of one of which is supplied with a second input signal, the gate electrode of the other field effect transistor being maintained at a constant voltage, resistor means connected to respective drain electrodes of said field effect transistors, the resistance value of said resistor means being such that the gradient of the characteristic of the drain current to the first input signal is substantially equal to that of the characteristic of the drain current to the second input signal, and a differential amplifier having two input terminals which are supplied with the signals corresponding to the drain currents of said field effect transistors, respectively, and an output terminal; and wherein the first and second input signals of a first of said $n-1$ multiplier stages correspond to said first and second ones of said $n$ respective input signals; and the first and second input signals of each $j^{th}$ stage of the $n-1$ multiplier stages additional to said first multiplier stage correspond to $a(j+1)^{th}$ one of said $n$ respective input signals and the output of the differential amplifier of the $(j-1)^{th}$ multiplier stage, respectively, where $1 < j \leq n-1$.

* * * * *